(12) United States Patent
Sarashina et al.

(10) Patent No.: US 10,692,714 B2
(45) Date of Patent: Jun. 23, 2020

(54) METHOD FOR CLEANING SEMICONDUCTOR WAFER

(71) Applicant: SHIN-ETSU HANDOTAI CO., LTD., Tokyo (JP)

(72) Inventors: Susumu Sarashina, Nagano (JP); Tomofumi Takano, Nagano (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 16/079,264

(22) PCT Filed: Feb. 22, 2017

(86) PCT No.: PCT/JP2017/006512
§ 371 (c)(1),
(2) Date: Aug. 23, 2018

(87) PCT Pub. No.: WO2017/159246
PCT Pub. Date: Sep. 21, 2017

(65) Prior Publication Data
US 2019/0066999 A1    Feb. 28, 2019

(30) Foreign Application Priority Data

Mar. 18, 2016 (JP) ................................. 2016-055294

(51) Int. Cl.
*H01L 21/02* (2006.01)
*H01L 21/304* (2006.01)
(Continued)

(52) U.S. Cl.
CPC .......... *H01L 21/02052* (2013.01); *B08B 3/08* (2013.01); *H01L 21/304* (2013.01); *H01L 21/67057* (2013.01)

(58) Field of Classification Search
CPC ......... H01L 21/02052; H01L 21/67057; B08B 3/08
See application file for complete search history.

(56) References Cited

U.S. PATENT DOCUMENTS 6,165,279 A * 12/2000 Tsao .......................... C11D 7/02
134/2
6,240,933 B1 * 6/2001 Bergman ................... B08B 3/08
134/1.3
(Continued)

FOREIGN PATENT DOCUMENTS

JP    H11-283947 A    10/1999
JP    2001-053016 A    2/2001
(Continued)

OTHER PUBLICATIONS

Mar. 21, 2017 Search Report issued in International Patent Application No. PCT/JP2017/006512.

*Primary Examiner* — Sharidan Carrillo
(74) *Attorney, Agent, or Firm* — Oliff PLC

(57) ABSTRACT

A method for cleaning a semiconductor wafer by using a chemical tank containing an SC-2 solution including, a plurality of the chemical tanks are used, and among SC-2 solutions contained in the plurality of chemical tanks, an HCl concentration in an SC-2 solution contained in a chemical tank to be finally used is lowered to the lowest to clean the semiconductor wafer. The method for cleaning a semiconductor wafer thus provided can improve the particle level in SC-2 cleaning for a semiconductor wafer without degrading the metal impurity level on the semiconductor wafer surface.

4 Claims, 16 Drawing Sheets

(51) Int. Cl.
*B08B 3/08* (2006.01)
*H01L 21/67* (2006.01)

(56) References Cited

U.S. PATENT DOCUMENTS

| | | | | |
|---|---|---|---|---|
| 6,589,356 | B1* | 7/2003 | Chang | H01L 21/02046 134/1 |
| 7,071,077 | B2* | 7/2006 | Maleville | B08B 3/12 257/E21.122 |
| 2002/0062841 | A1* | 5/2002 | Twu | B08B 3/08 134/3 |
| 2003/0000548 | A1* | 1/2003 | Tsuga | B08B 3/08 134/1.3 |
| 2003/0106572 | A1* | 6/2003 | Nishiki | B08B 3/08 134/26 |
| 2003/0201001 | A1* | 10/2003 | Chien | B08B 3/08 134/61 |
| 2005/0139230 | A1 | 6/2005 | Miyata et al. | |
| 2005/0177267 | A1* | 8/2005 | Chang | H01L 21/67271 700/121 |
| 2006/0054181 | A1* | 3/2006 | Rayandayan | C11D 3/044 134/1 |
| 2012/0260952 | A1* | 10/2012 | Nonaka | H01L 21/02052 134/30 |
| 2019/0066999 | A1* | 2/2019 | Sarashina | H01L 21/02052 |

FOREIGN PATENT DOCUMENTS

| | | |
|---|---|---|
| JP | 2005-64276 A | 3/2005 |
| JP | 2005-210075 A | 8/2005 |
| JP | 2015-041753 A | 3/2015 |

* cited by examiner

*TEDUKA et al.: PROCEEDINGS OF 20th UCT
SYMPOSIUM, p. 353 (1993), PARTIALLY
EMPHASIZED

METHOD FOR CLEANING SEMICONDUCTOR WAFER

TECHNICAL FIELD

The present invention relates to a method for cleaning a semiconductor wafer.

BACKGROUND ART

Heretofore, as a method for cleaning a semiconductor wafer such as a silicon wafer, a cleaning method called RCA cleaning using a SC-1 (Standard Cleaning 1) solution and a SC-2 (Standard Cleaning 2) solution has been widely employed. The SC-1 solution is an aqueous solution of ammonium hydroxide and hydrogen peroxide, and is characterized by quite excellent performance of removing particles on the semiconductor wafer surface. The SC-2 solution is an aqueous solution of hydrochloric acid and hydrogen peroxide, and plays a role in removing metal impurities.

For example, Patent Literature 1 describes a method for cleaning a semiconductor wafer by using an SC-1 solution and an SC-2 solution to prevent anions from adhering to the semiconductor wafer surface when the SC-2 solution is used in cleaning (SC-2 cleaning). In the method, the SC-1 solution is used in cleaning (SC-1 cleaning) in such a manner that a cationized metal remains on the surface of the semiconductor wafer.

CITATION LIST

Patent Literature

Patent Literature 1: Japanese Unexamined Patent Application Publication No. 2005-64276

DISCLOSURE OF INVENTION

Problem to be Solved by the Invention

Since the SC-1 solution is an alkaline solution, the wafer surface and the surfaces of various particles are both negatively charged at the time of SC-1 cleaning. Hence, the electrostatic repulsion therebetween suppresses the adhesion of the particles. Nevertheless, since the SC-2 solution is an acidic solution, the wafer surface and the particle surfaces are not always charged with the same sign at the time of SC-2 cleaning. This brings about a problem of higher incidences of particle adhesion. Moreover, the higher the concentration of HCl to be added to the SC-2 solution, or the longer the SC-2 cleaning time, the more likely it is that the particles adhere to the wafer surface. The degradation of the particle level can be suppressed by shortening the SC-2 cleaning time and lowering the HCl concentration in the SC-2 solution. In this case, however, the metal removal effect by the acid is decreased, so that the metal impurity level is degraded.

The present invention has been made in view of the above problems. An object of the present invention is to provide a method for cleaning a semiconductor wafer, which makes it possible to improve the particle level in SC-2 cleaning for the semiconductor wafer without degrading the metal impurity level on the semiconductor wafer surface.

Means for Solving Problem

To achieve the above object, the present invention provides a method for cleaning a semiconductor wafer by using a chemical tank containing an SC-2 solution, wherein a plurality of the chemical tanks are used, and among SC-2 solutions contained in the plurality of chemical tanks, an HCl concentration in an SC-2 solution contained in a chemical tank to be finally used is lowered to the lowest to clean the semiconductor wafer.

In such a method for cleaning a semiconductor wafer, the HCl concentration in the SC-2 solution contained in the chemical tank to be finally used is lowered to the lowest among the SC-2 solutions contained in the plurality of chemical tanks. Hence, particles hardly adhere to the semiconductor wafer surface after the SC-2 cleaning. Moreover, in the tank(s) used before the chemical tank to be finally used, the HCl concentration is higher than that in the final tank. Hence, the metal impurities can also be removed sufficiently. Further, the use of the plurality of chemical tanks for the SC-2 cleaning enables the downstream tank(s) to remove metal impurities which are not completely cleaned off by the first chemical tank. Note that, in the following description, a chemical tank containing an SC-1 solution and a chemical tank containing an SC-2 solution will be also referred to as an SC-1 tank and an SC-2 tank, respectively.

In addition, an HCl concentration in an SC-2 solution contained in a secondly-used chemical tank and a subsequent chemical tank is preferably lower than that in an initially-used tank.

According to such a method for cleaning a semiconductor wafer, it is possible to surely remove metal impurities and more surely suppress the degradation of the particle level on the semiconductor wafer surface.

Furthermore, the semiconductor wafer is preferably a silicon wafer.

The method for cleaning a semiconductor wafer of the present invention can be particularly suitably employed to clean a silicon wafer.

Effect of the Invention

The method for cleaning a semiconductor wafer of the present invention makes it possible to improve the particle level without degrading the metal impurity level.

BEST MODES FOR CARRYING OUT THE INVENTION

Hereinafter, the present invention will be described in more details.

As described above, a method for cleaning a semiconductor wafer is desired which makes it possible to improve the particle level in SC-2 cleaning for the semiconductor wafer without degrading the metal impurity level on the semiconductor wafer surface.

The present inventors, first, examined a relation between the adhesion and zeta potential of particles in a chemical tank containing an SC-2 solution. Hereinafter, this relation will be described with reference to FIGS. 6 to 9.

Figure 6:
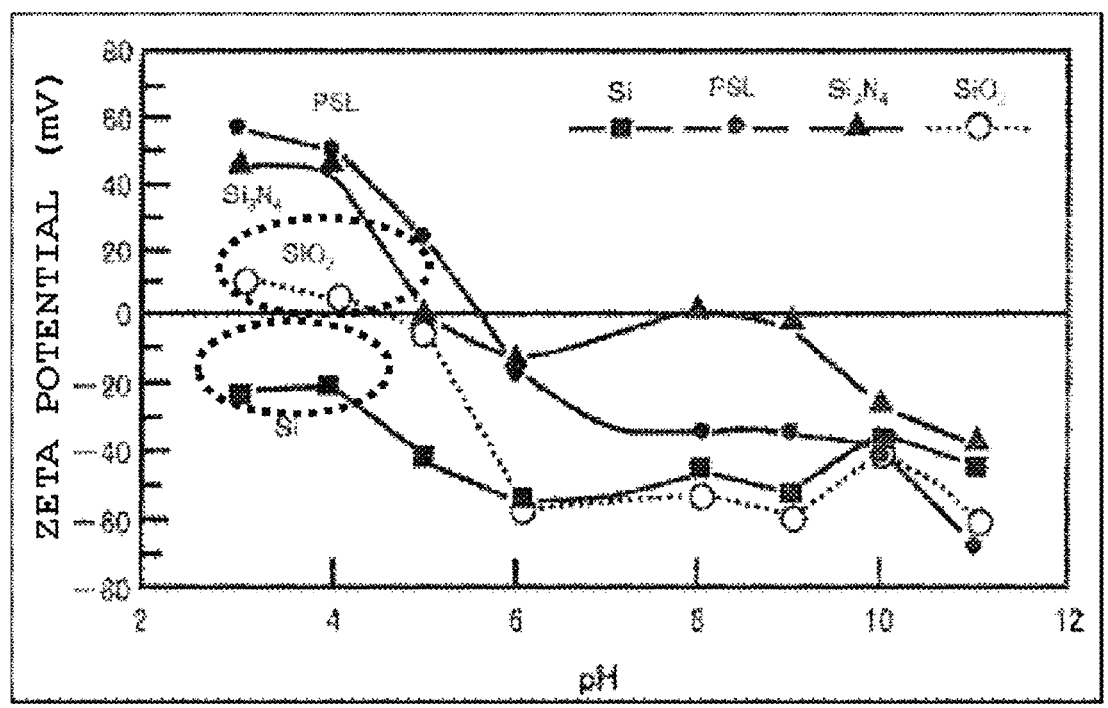
FIG. 6 is a graph showing a relation between the zeta potential ($\psi$) of particles and the pH.
Figure 7:
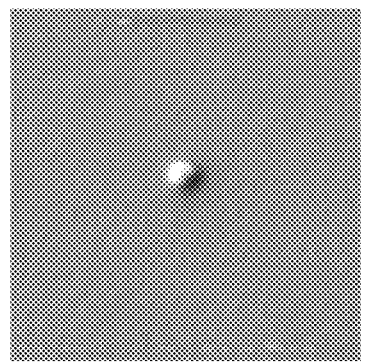
FIG. 7 is a photograph, obtained by SEM/EDX, of $SiO_2$ which is surrounded by a dotted line in FIG. 6.
Figure 8:
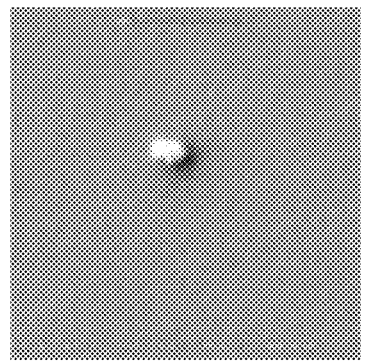
FIG. 8 is a photograph, obtained by SEM/EDX, of Si which is surrounded by a dotted line in FIG. 6.
Figure 9:
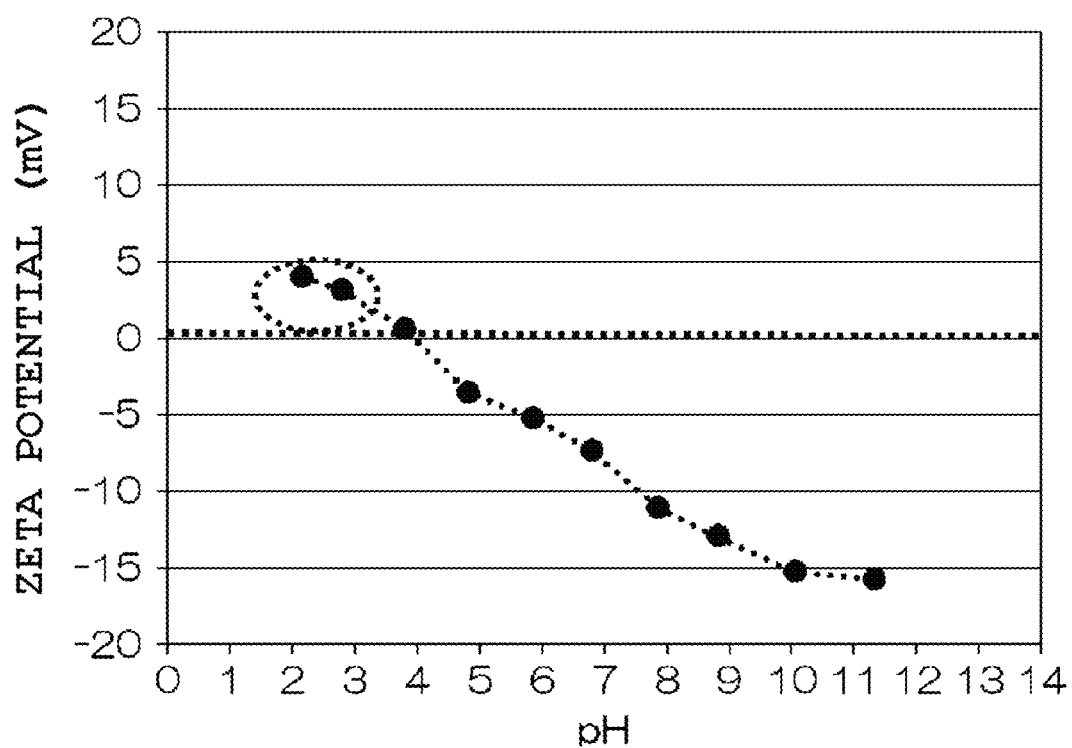
FIG. 9 is a graph showing a relation between the zeta potential (ψs) at a silicon wafer surface and the pH.

FIG. 6 is a graph showing a relation between the zeta potential (ψ) of particles and the pH. In FIG. 6, the particles include those of Si, PSL (polystyrene latex), $Si_3N_4$, and $SiO_2$. Moreover, FIG. 7 shows a photograph, obtained by SEM (Scanning Electro Microscopy)/EDX (Energy Dispersive X-ray spectroscopy), of $SiO_2$ which is surrounded by a dotted line in FIG. 6. Further, FIG. 8 shows a photograph, obtained by SEM/EDX, of Si which is surrounded by a dotted line in FIG. 6. Furthermore, FIG. 9 is a graph showing a relation between the zeta potential (ψs) at a silicon wafer surface and the pH.

As shown in portions surrounded by the dotted lines in FIG. 6, the absolute values of the zeta potentials of $SiO_2$ and Si particles and the like in an acidic range (pH of approximately 2 to 4), that is, in an SC-2 tank containing an acidic solution, are smaller than those in an alkaline range. Moreover, as shown in a portion surrounded by a dotted line in FIG. 9, the zeta potential at the silicon wafer surface is approximately 0 slightly on the plus side in an acidic range. Here, the theoretical formula of the electrical repulsion (Vr) is as follows. Accordingly, it can be seen that the electrical repulsion between the silicon wafer surface and the particles is weaker in an SC-2 tank (acidic) than in an SC-1 tank (alkaline). Particularly, $SiO_2$ and Si particles and the like whose absolute values of the zeta potentials in the acidic range are small are likely to adhere to the silicon wafer after the SC-2 cleaning.

$$V_r = \frac{\varepsilon a}{4}\left\{(\psi^2 + \psi_s^2)\ln\frac{\exp(2\kappa x)-1}{\exp(2\kappa x)} + 2\psi\psi_s\ln\frac{\exp(\kappa x)+1}{\exp(\kappa x)-1}\right\}$$

ψ: Particle surface potential (≈ zeta potential)

$\psi_s$: Wafer surface potential (≈ zeta potential)

κ: Debye constant (depends on the ion concentration in the solution)

α: Particle radius

ε: Permittivity of the solution x: Distance

Meanwhile, since the SC-1 solution is an alkaline solution, the wafer surface and the surfaces of various particles are both negatively charged at the time of SC-1 cleaning. Hence, the electrostatic repulsion therebetween suppresses the adhesion of the particles. Nevertheless, since the SC-2 solution is an acidic solution, the wafer surface and the particle surfaces are not always charged with the same sign at the time of SC-2 cleaning. This brings about a problem that particles are likely to adhere (see FIGS. 6 to 9 and the above theoretical formula).

Figure 10:
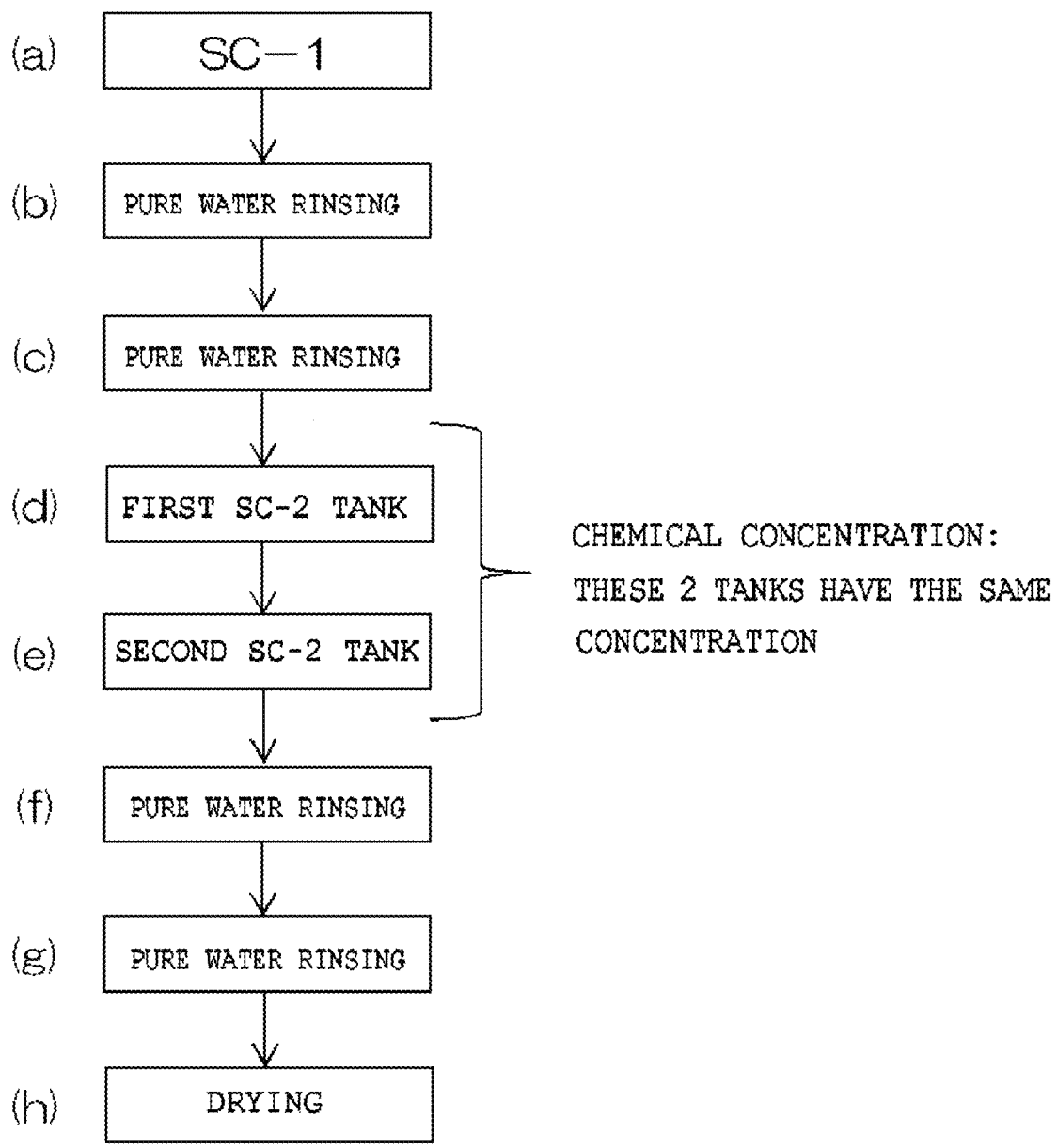
FIG. 10 is a flow chart for illustrating an example of a method for cleaning a semiconductor wafer by using two SC-2 tanks which contain SC-2 solutions having the same composition.
Figure 11:
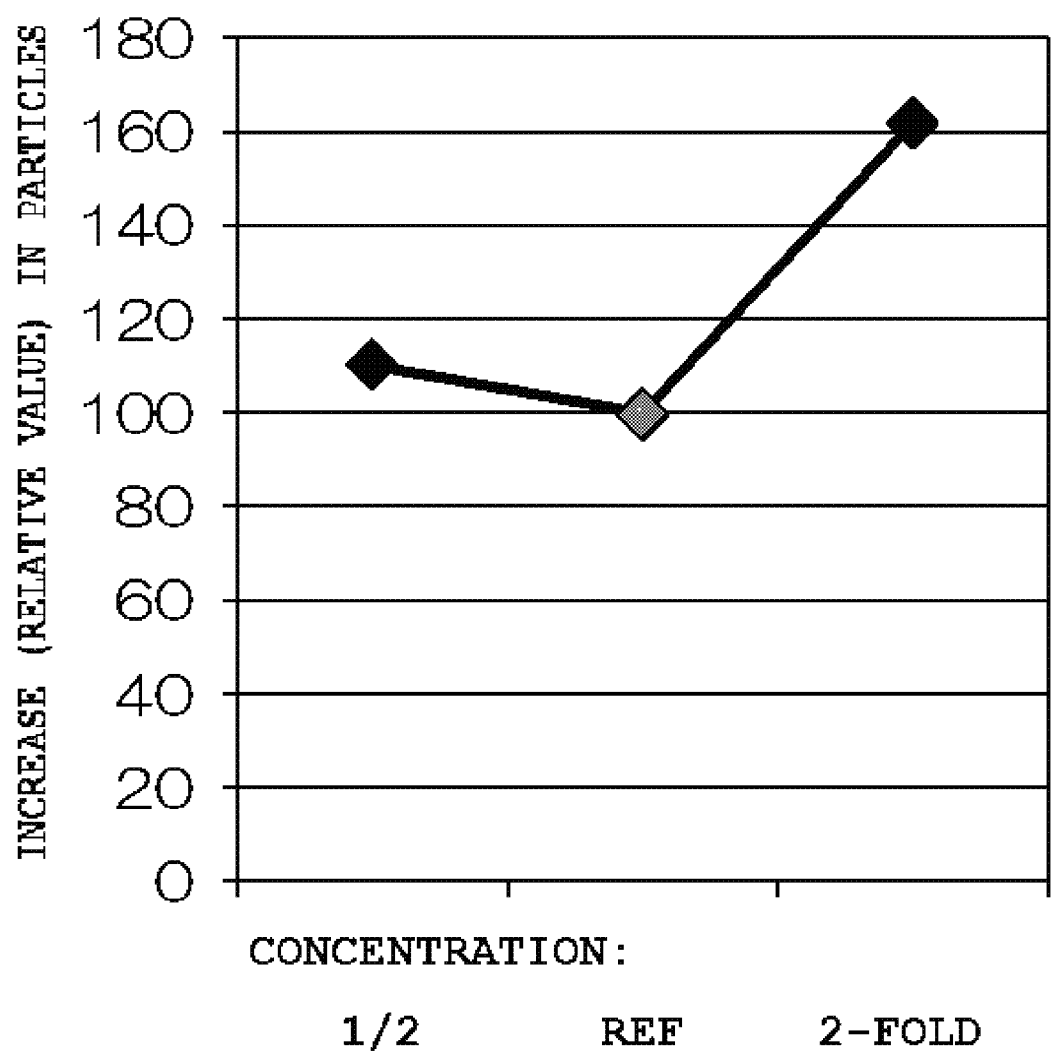
FIG. 11 is a graph showing a relation between the HCl concentration and the amount of particles increased by the SC-2 cleaning.
Figure 12:
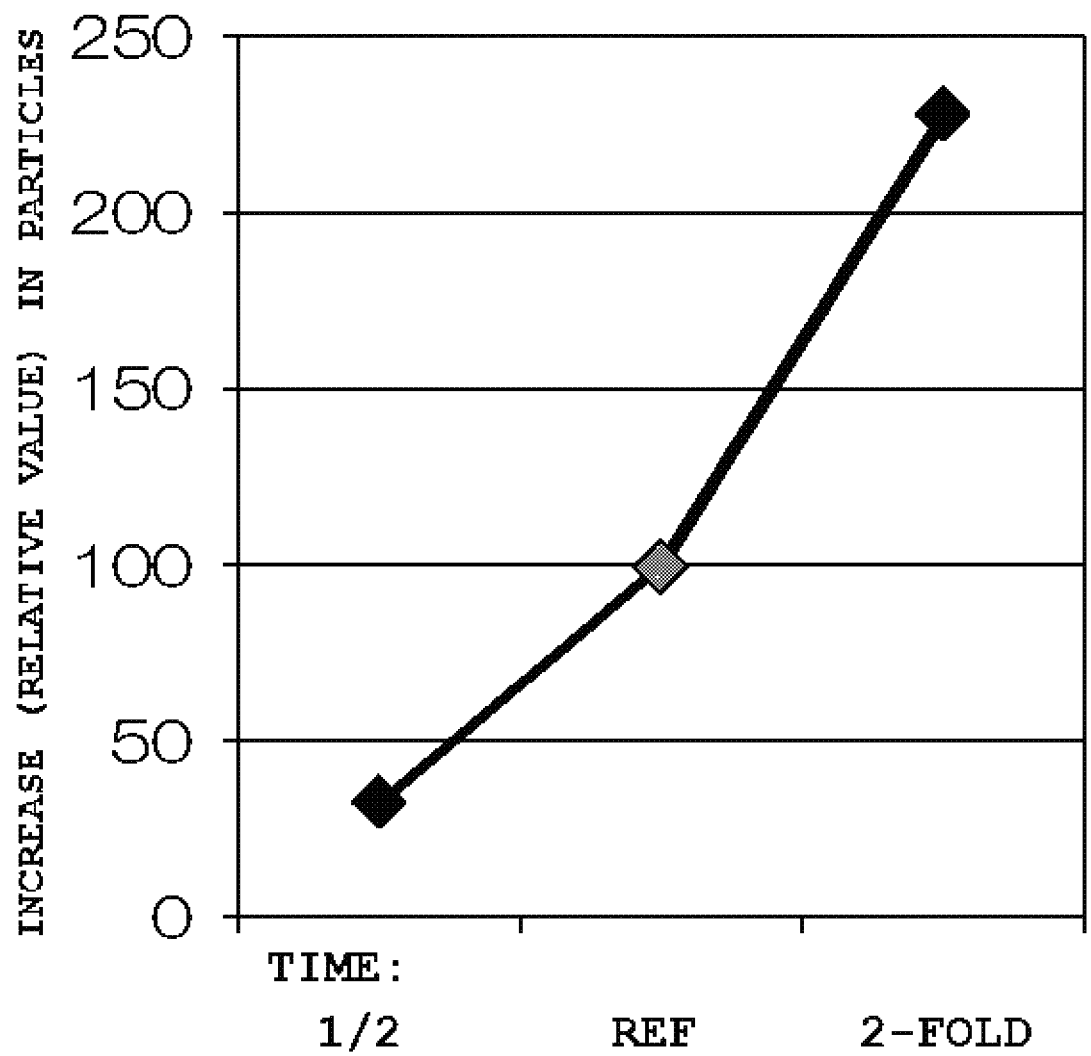
FIG. 12 is a graph showing a relation between the SC-2 cleaning time and the amount of particles increased by the SC-2 cleaning.

Next, the present inventors examined the amount of particles increased by cleaning while changing conditions of the SC-2 tank. Hereinafter, relations between the SC-2 cleaning conditions and the amount of particles increased will be described with reference to FIGS. 10 to 12. FIG. 10 is a flow chart for illustrating an example of a method for cleaning a semiconductor wafer by using two SC-2 tanks which contain SC-2 solutions having the same composition. As REF conditions (reference conditions) for the SC-2 cleaning, an initially-used SC-2 tank and a secondly-used SC-2 tank were each set to have a concentration (volume ratio) of $HCl:H_2O_2:H_2O=1:1:100$, the temperature was set to 80° C., and the time was set to 125 seconds. Moreover, FIG. 11 is a graph showing a relation between the HCl concentration and the amount of particles increased by the SC-2 cleaning. FIG. 11 shows that the amount of particles increased under the REF conditions and those by doubling or halving the HCl concentrations in the SC-2 solutions in both the initially- and secondly-used tanks from the REF conditions. Further, FIG. 12 is a graph showing a relation between the SC-2 cleaning time and the amount of particles increased by the SC-2 cleaning. FIG. 12 shows the amount of particles increased under the REF conditions, and those by doubling or halving the SC-2 cleaning time in both the initially- and secondly-used tanks from the REF conditions.

As shown in FIGS. 10 to 12, the higher the concentration of HCl to be added to the SC-2 solution, and the longer the SC-2 cleaning time, the more likely it is that the particles adhere to the wafer surface.

Figure 13:
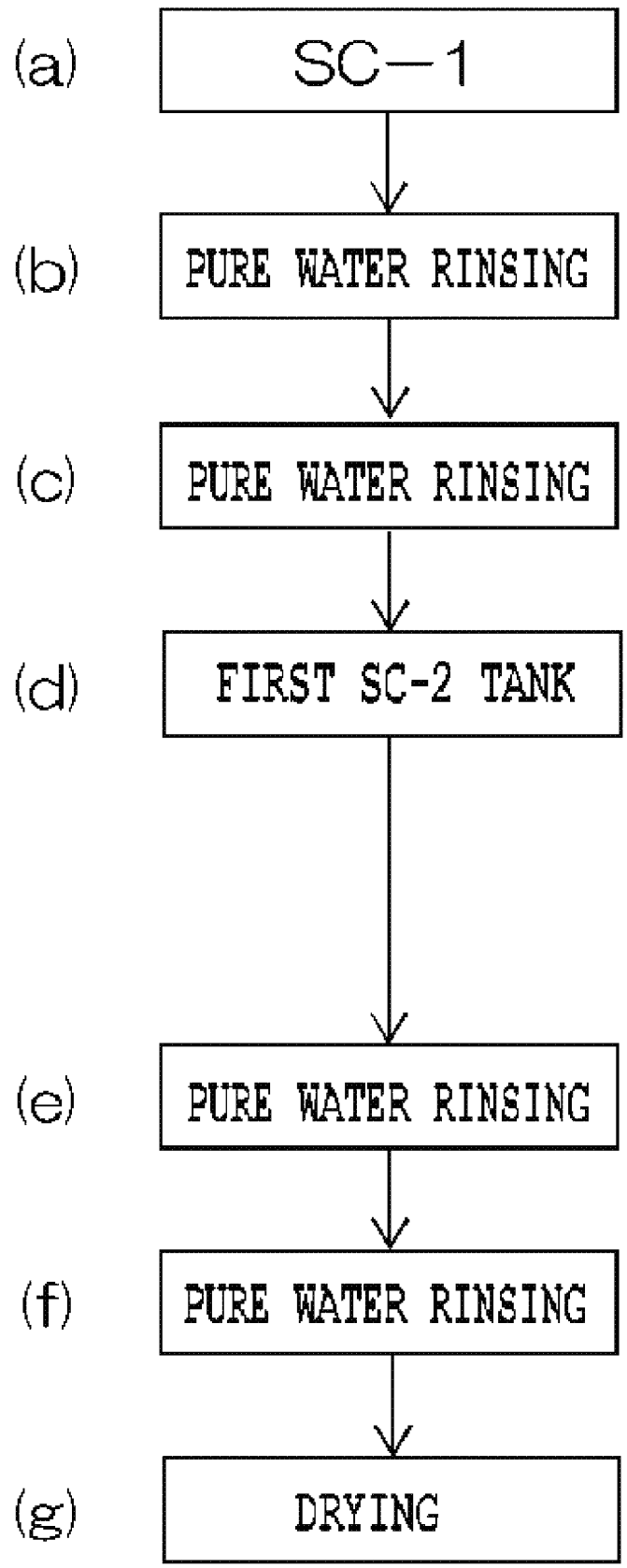
FIG. 13 is a flow chart for illustrating an example of a method for cleaning a semiconductor wafer by using only one SC-2 tank.
Figure 14:
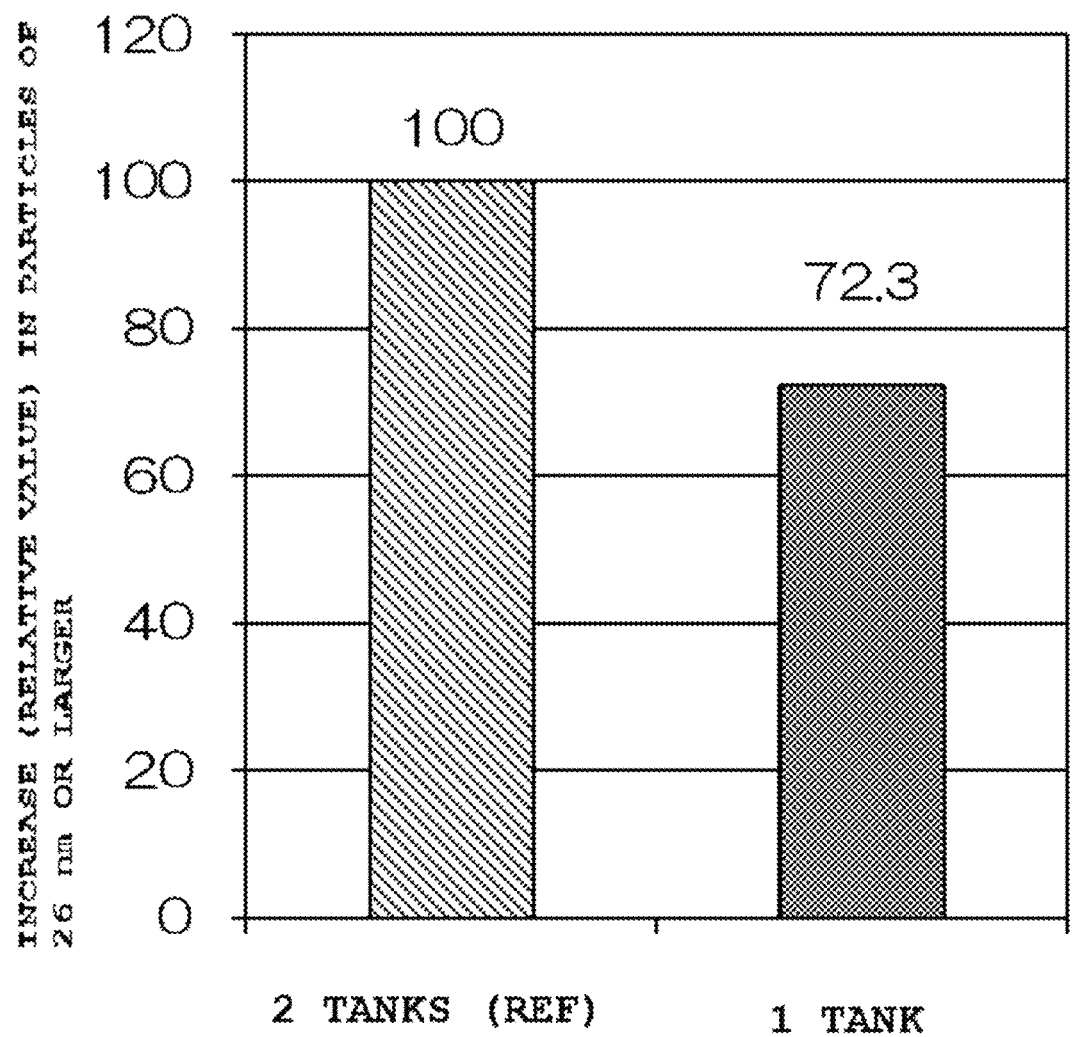
FIG. 14 is a graph showing, by relative values, a relation between the number of SC-2 tanks and the number of particles of 26 nm or larger per silicon wafer after the SC-2 cleaning.
Figure 15:
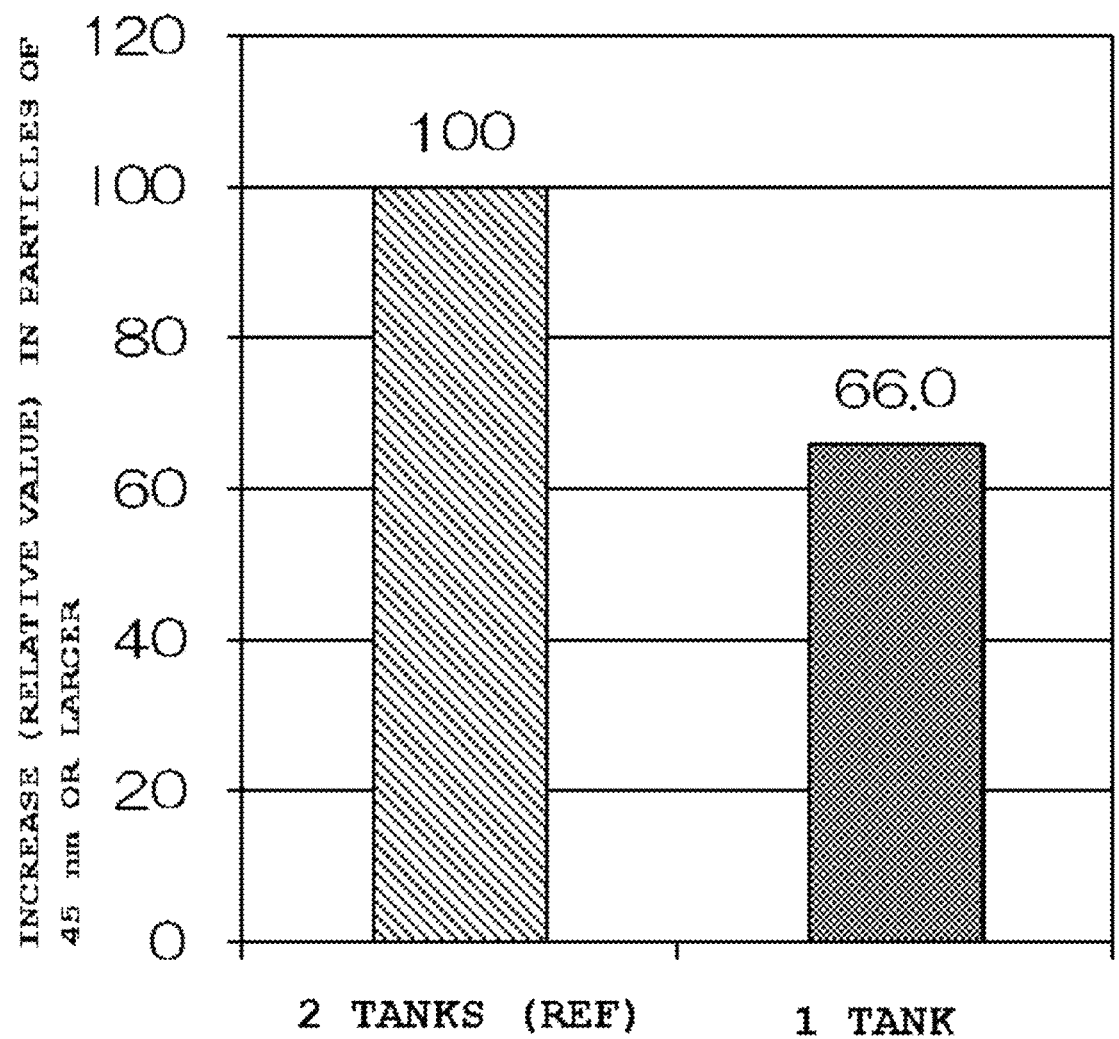
FIG. 15 is a graph showing, by relative values, a relation between the number of SC-2 tanks and the number of particles of 45 nm or larger per silicon wafer after the SC-2 cleaning.
Figure 16:
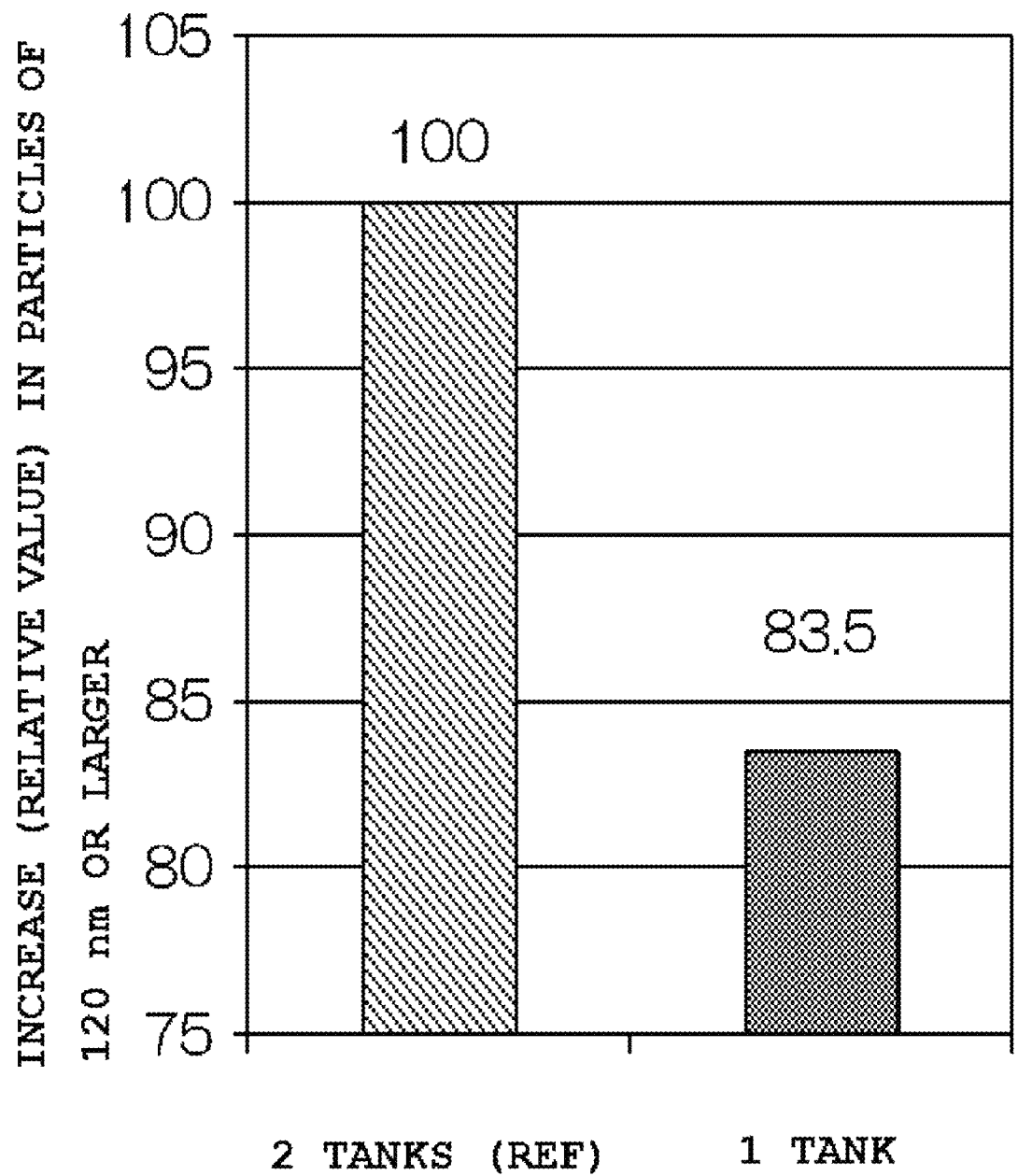
FIG. 16 is a graph showing, by relative values, a relation between the number of SC-2 tanks and the number of particles of 120 nm or larger per silicon wafer after the SC-2 cleaning.
Figure 17:
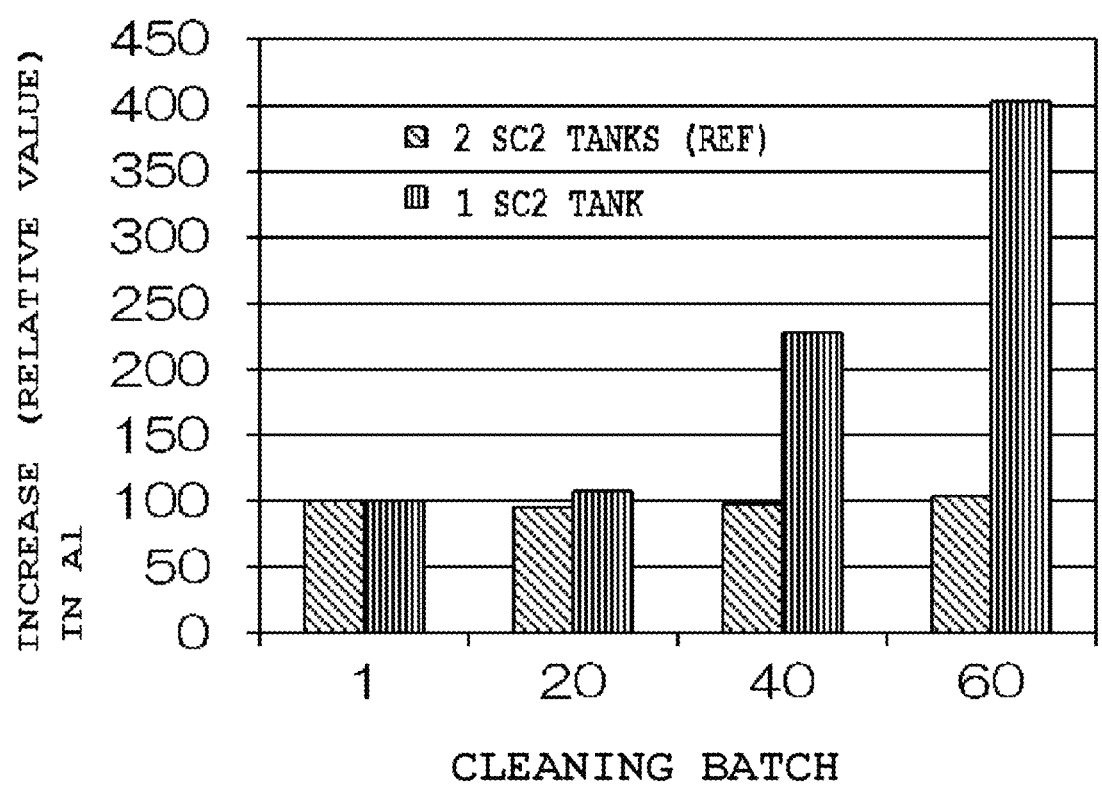
FIG. 17 is a graph for relatively comparing a relation of the Al concentration on the silicon wafer surface after the SC-2 cleaning to cleaning batches for SC-2 cleaning between the case of using one SC-2 tank and the case of using two SC-2 tanks.

Further, the present inventors performed SC-2 cleaning by reducing the number of SC-2 tanks from two to one. Hereinafter, with reference to FIGS. 13 to 17, description will be given of relations between the particle level and the metal impurity level after a silicon wafer is subjected to SC-2 cleaning by using only one SC-2 tank. Note that, in this examination, the cleaning conditions were the same as the REF conditions in FIG. 10, except that the number of SC-2 tanks was reduced from two to one. FIG. 13 is a flow chart for illustrating an example of the method for cleaning a semiconductor wafer by using only one SC-2 tank. Moreover, FIGS. 14 to 16 are graphs showing, by relative values, a relation between the number of SC-2 tanks and the number of particles per silicon wafer after the SC-2 cleaning. FIG. 14 shows the number of particles of 26 nm or larger counted with a particle inspection system SP3 (manufactured by KLA-Tencor Corporation), FIG. 15 shows the number of particles of 45 nm or larger counted with a particle inspection system SP2 (manufactured by KLA-Tencor Corporation), and FIG. 16 shows the number of particles of 120 nm or larger counted with SP2. Further, FIG. 17 is a graph for relatively comparing a relation of the Al concentration on the silicon wafer surface after the SC-2 cleaning to cleaning batches for SC-2 cleaning between the case of using one SC-2 tank and the case of using two SC-2 tanks.

As shown in FIGS. 14 to 17, the particle levels are improved by reducing the number of SC-2 tanks from two to one. However, in this case, increasing the number of the cleaning batches increases the Al detection level, and degrades the metal impurity level.

As shown in FIGS. 10 to 17, it is possible to suppress the degradation of the particle level by shortening the SC-2 cleaning time and lowering the HCl concentration in the SC-2 solution. In this case, however, the metal removal effect by the acid is decreased, so that the metal impurity level is degraded.

The present inventors further studied to solve the above problems. As a result, the inventors found that the problems can be solved by a method for cleaning a semiconductor wafer by using a chemical tank containing an SC-2 solution characterized as follows. In the method, a plurality of the chemical tanks are used, and among SC-2 solutions contained in the plurality of chemical tanks, an HCl concentration in an SC-2 solution contained in a chemical tank to be finally used is lowered to the lowest to clean the semiconductor wafer. This finding has led to the completion of the present invention.

Hereinafter, embodiments of the present invention will be specifically described. However, the present invention is not limited thereto.

As described above, in the method for cleaning a semiconductor wafer of the present invention, a plurality of SC-2 tanks are used in SC-2 cleaning for a semiconductor wafer. Among SC-2 solutions contained in the plurality of SC-2 tanks, an HCl concentration in an SC-2 solution contained in an SC-2 tank to be finally used is lowered to the lowest to clean a semiconductor wafer. In such a method for cleaning a semiconductor wafer, the HCl concentration in the SC-2 solution contained in the chemical tank to be finally used is lowered to the lowest among the SC-2 solutions contained in the plurality of chemical tanks. This makes particles hardly adhere to the semiconductor wafer surface after the SC-2 cleaning. Moreover, since the HCl concentration in the tank(s) used before the chemical tank to be finally used is higher than that in the final tank, it is also possible to sufficiently remove metal impurities. Further, since the plurality of chemical tanks are used in the SC-2 cleaning, even if metal impurities are not completely cleaned off with the first chemical tank, the downstream tank(s) will remove such metal impurities.

In this case, the HCl concentration in an SC-2 solution contained in a secondly-used chemical tank, i.e., second chemical tank, and a subsequent chemical tank is preferably lower than that in the initially-used tank, i.e., first chemical tank. This makes it possible to surely remove metal impurities and more surely suppress the degradation of the particle level on the semiconductor wafer surface.

The semiconductor wafer cleaned according to the present invention is not particularly limited. Besides a silicon wafer, it is also possible to use an elemental semiconductor such as germanium, a compound semiconductor such as GaAs or InP, or the like. Above all, the method for cleaning a semiconductor wafer of the present invention can be particularly suitably employed to clean a silicon wafer.

Hereinafter, the method for cleaning a semiconductor wafer of the present invention will be described with reference to FIG. 1. Now, the description will be given of a case where two SC-2 tanks are used, and between SC-2 solutions contained in the two SC-2 tanks, an SC-2 solution contained in the secondly-used SC-2 tank has the lower HCl concentration than that in the initially-used tank to clean a semiconductor wafer. Nevertheless, the present invention is not limited thereto. For example, the present invention may also use three SC-2 tanks such that, among SC-2 solutions contained in the three SC-2 tanks, SC-2 solutions contained in the initially- and secondly-used SC-2 tanks have the same HCl concentration, while an SC-2 solution contained in the finally-used SC-2 tank has a lower HCl concentration than those in the initially- and secondly-used tanks to clean a semiconductor wafer. Alternatively, although three SC-2 tanks are used, a semiconductor wafer can also be cleaned with SC-2 solutions contained in these SC-2 tanks satisfying such a relation that the HCl concentrations are decreased in the order of: initially-used tank>secondly-used tank>thirdly-used tank. Note that the number of SC-2 tanks used in the present invention should be plural. For example, 2 to 5 tanks can be used.

First, a semiconductor wafer is subjected to SC-1 cleaning (FIG. 1(a)). For example, an SC-1 tank is filled with an aqueous solution of ammonium hydroxide and hydrogen peroxide (SC-1 solution), and the semiconductor wafer is immersed in the SC-1 solution to clean the semiconductor wafer. The material of the SC-1 tank is not particularly limited. For example, an SC-1 tank made of silica glass can be used.

Figure 1:
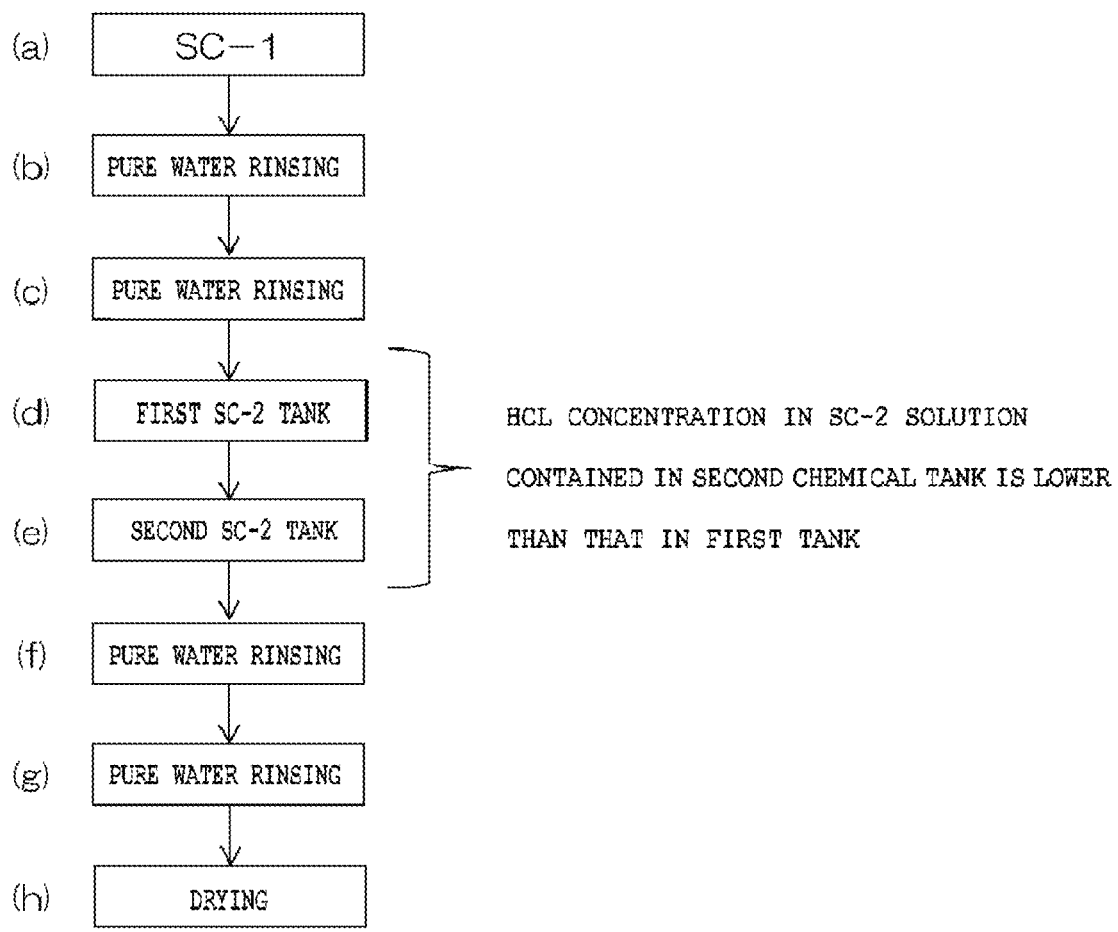
FIG. 1 is a flow chart for illustrating an example of a method for cleaning a semiconductor wafer of the present invention.

Next, the semiconductor wafer having undergone the SC-1 cleaning is rinsed with pure water (FIGS. 1(b), (c)). In this event, ultrapure water can be used. In the method for cleaning a semiconductor wafer shown in FIG. 1, the pure water rinsing is performed four times in total, but these pure water rinsing conditions may be the same or different from each other.

Next, the semiconductor wafer having undergone the pure water rinsing is subjected to SC-2 cleaning (FIG. 1(d)). For example, an SC-2 tank is filled with an aqueous solution of hydrochloric acid and hydrogen peroxide (SC-2 solution), and the semiconductor wafer is immersed in the SC-2 solution to clean the semiconductor wafer. The material of the SC-2 tank is not particularly limited. For example, an SC-2 tank made of silica glass can be used.

The composition of the SC-2 solution contained in the initially-used SC-2 tank is not particularly limited. The SC-2 solution having the same composition as that of a conventional SC-2 solution may be used for the cleaning according to a conventional method. Nevertheless, the HCl concentration in the SC-2 solution of the initially-used tank has to be higher than that in the secondly-used tank described later.

The HCl concentration in the SC-2 solution of the initially-used tank can be, for example, 0.3 to 2 mass %. The SC-2 solution of the initially-used tank may have a pH of, for example, 1 to 4.

The $H_2O_2$ concentration in the SC-2 solution of the initially-used tank is not particularly limited, and can be, for example, 0.01 to 2 mass %.

The temperature of the SC-2 solution of the initially-used tank is not particularly limited, and can be, for example, 40 to 90° C.

The time of the first SC-2 cleaning is not particularly limited, and may be shorter than the case of using only one SC-2 tank. This is because a plurality of SC-2 tanks are used in the present invention. The cleaning time can be, for example, 50 to 200 seconds.

Next, the semiconductor wafer having undergone the first SC-2 cleaning is subjected to second SC-2 cleaning (FIG. 1(e)). In the method for cleaning a semiconductor wafer shown in FIG. 1, two SC-2 tanks are prepared such that the HCl concentration in the SC-2 solution contained in the downstream tank is lower than that in the upstream tank. In the downstream tank, the amount of hydrochloric acid is very small, but the pH is in an acidic range. Thereby, the HCl concentration in the SC-2 solution contained in the downstream tank is lower than that in the upstream tank, making the particles scarcely adhere. Nevertheless, even if the metal impurities are not completely cleaned off by the upstream tank, the removal and thus cleaning are still possible because the SC-2 solution of the secondly-used tank is acidic. The HCl concentration in the SC-2 solution of the secondly-used tank can be, for example, 0.001 to 0.2 mass %. The SC-2 solution of the secondly-used tank may have a pH of, for example, 2 to 6.

The temperature of the SC-2 solution of the secondly-used tank is not particularly limited, and can be, for example, 40 to 90° C. The temperature of the SC-2 solution of the initially-used tank and that of the SC-2 solution of the secondly-used tank may be the same or different from each other.

The time of the second SC-2 cleaning is not particularly limited, and can be, for example, 50 to 200 seconds. The time of the first SC-2 cleaning and that of the second SC-2 cleaning may be the same or different from each other.

In the present invention, when semiconductor wafers are cleaned in a batch, the SC-2 solutions may be replaced with fresh solutions for every batch. For the cost reduction, single solutions may be used for a predetermined number of batches, for example, up to 80 batches. In such a case also, since the present invention uses a plurality of SC-2 tanks, the metal impurity level is hardly degraded. Note that the number of semiconductor wafers treated in one batch is not particularly limited. For example, the number can be 5 to 25.

Next, the semiconductor wafer having undergone the second SC-2 cleaning is rinsed with pure water (FIGS. 1(f), (g)).

Next, the semiconductor wafer having undergone the fourth pure water rinsing is dried (FIG. 1(h)).

EXAMPLES

Hereinafter, the present invention will be more specifically described by referring to Examples and Comparative Examples. However, the present invention is not limited to Examples described below.

Example 1

According to the flow chart shown in FIG. 1, mirror-polished, boron-doped p type single crystal silicon wafers 300 mm in diameter were cleaned. Note that, in Examples and Comparative Examples described below, the cleaning was carried out by treating 25 silicon wafers in one batch.

First, the silicon wafers were subjected to SC-1 cleaning by using an SC-1 tank made of silica glass (FIG. 1(a)). As the SC-1 cleaning conditions, the concentration (volume ratio) was $NH_4OH:H_2O_2:H_2O=1:1:20$, the temperature was 70° C., and the time was 125 seconds.

Next, the silicon wafers having undergone the SC-1 cleaning were subjected to pure water rinsing twice using ultrapure water (FIGS. 1(b), (c)).

Next, the silicon wafers having undergone the pure water rinsing were subjected to SC-2 cleaning by using an initially-used SC-2 tank made of silica glass (FIG. 1(d)). As the first SC-2 cleaning conditions, the HCl concentration was 0.4 mass %, the $H_2O_2$ concentration was 0.4 mass %, the pH was 1, the temperature was 80° C., and the time was 125 seconds.

Next, the silicon wafers having undergone the first SC-2 cleaning were subjected to second SC-2 cleaning by using a secondly-used SC-2 tank made of silica glass (FIG. 1(e)). As the second SC-2 cleaning conditions, the HCl concentration was 0.2 mass %, the $H_2O_2$ concentration was 0.4 mass %, the pH was 1, the temperature was 80° C., and the time was 125 seconds.

Next, the silicon wafers having undergone the second SC-2 cleaning were subjected to pure water rinsing twice using ultrapure water (FIGS. 1(f), (g)).

Next, the silicon wafers having undergone the fourth pure water rinsing were dried (FIG. 1(h)).

Example 2

Silicon wafers were cleaned according to the same procedure in Example 1, except that the HCl concentration in the second SC-2 cleaning was changed to 0.04 mass %.

Example 3

Silicon wafers were cleaned according to the same procedure in Example 1, except that the HCl concentration in the second SC-2 cleaning was changed to 0.01 mass %.

Example 4

Silicon wafers were cleaned according to the same procedure in Example 1, except that the HCl concentration and the $H_2O_2$ concentration in the second SC-2 cleaning were changed to 0.01 mass % and 0.1 mass %, respectively.

Comparative Example 1

According to the flow chart shown in FIG. 10, silicon wafers like those in Example 1 were cleaned. Specifically, the silicon wafers were cleaned according to the same procedure in Example 1, except that the HCl concentration in the second SC-2 cleaning was changed to 0.4 mass % (the HCl concentration was 0.4 mass % in both the initially- and secondly-used tanks).

Comparative Example 2

According to the flow chart shown in FIG. 13, silicon wafers like those in Example 1 were cleaned. Specifically, the silicon wafers were cleaned according to the same procedure in Example 1, except that the second SC-2 cleaning was not performed (only one SC-2 tank was used).

The metal impurity levels and the particle levels in Examples and Comparative Examples were evaluated as follows. First, before the SC-2 cleaning (for example, in the cleaning method in FIG. 1, after FIG. 1(c) but before FIG. 1(d)), particles were measured with the particle inspection system SP3 (manufactured by KLA-Tencor Corporation) in advance. After the SC-2 cleaning (for example, in the cleaning method in FIG. 1, after FIG. 1(h)) under the predetermined conditions, the particles were measured again. In comparing the results before and after the washing, if particles newly adhered, the particles were counted as increased points. In these Examples and Comparative Examples, amounts of particles degraded were examined based on the increased points. Moreover, in the metal impurity analysis after the SC-2 cleaning, the surface impurity concentrations of the silicon wafers were evaluated by ICP-MS (Inductively Coupled Plasma-Mass Spectroscopy) analysis.

Table 1 shows the results of the metal impurity levels and the particle levels. Note that Table 1 shows each average result of two silicon wafers cleaned in the 80th batch.

Figure 2:
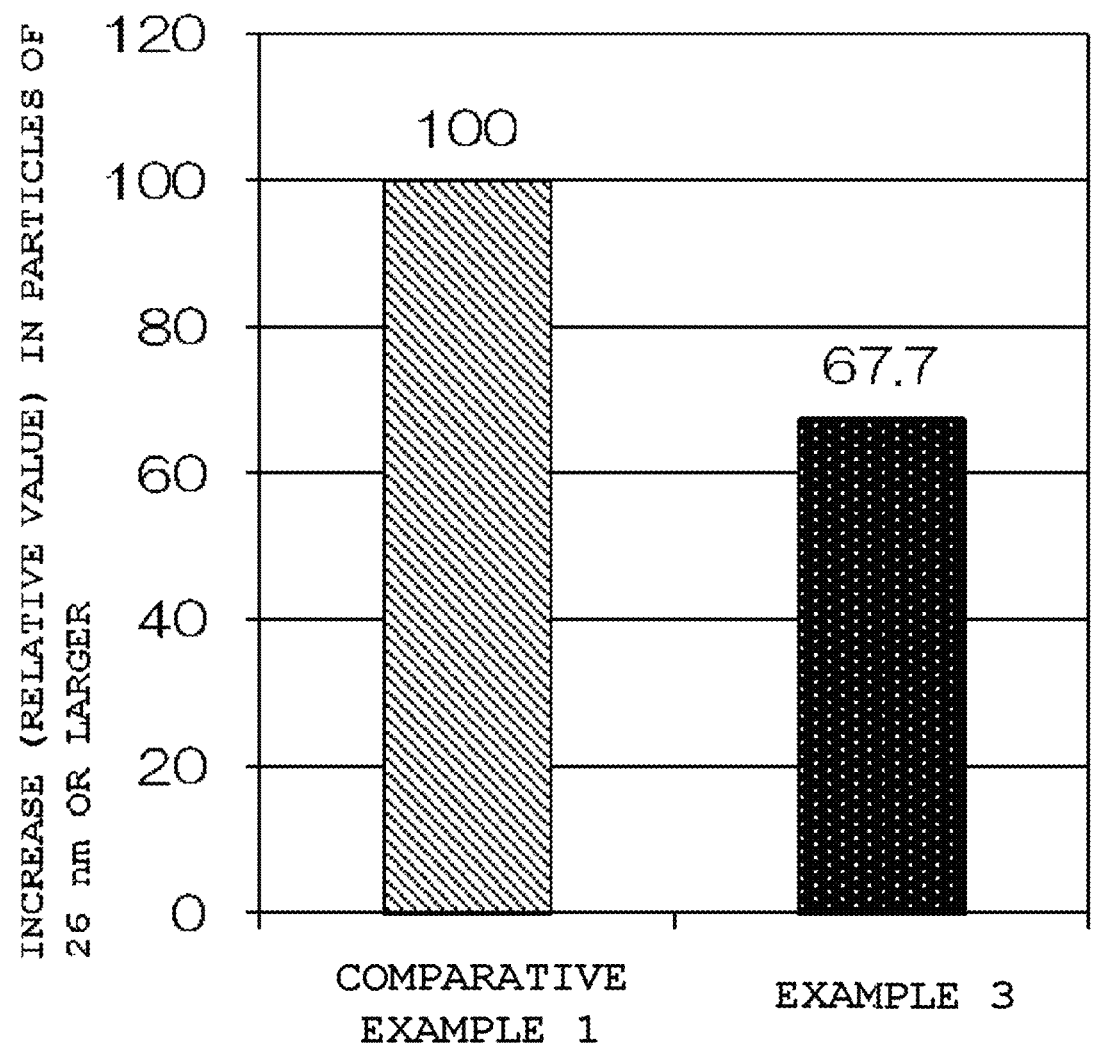
FIG. 2 is a graph for comparing the number of particles of 26 nm or larger per silicon wafer after the SC-2 cleaning by relative values between Example 3 and Comparative Example 1.
Figure 3:
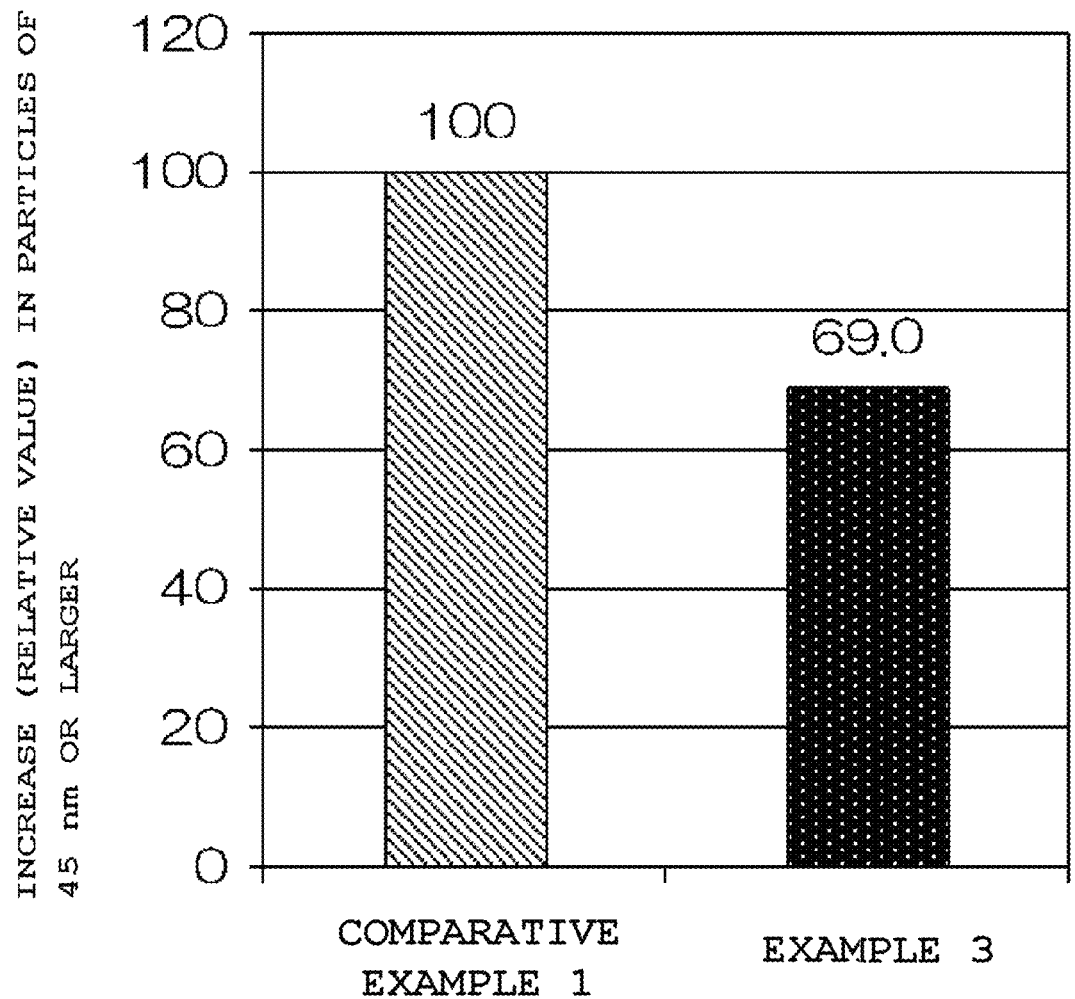
FIG. 3 is a graph for comparing the number of particles of 45 nm or larger per silicon wafer after the SC-2 cleaning by relative values between Example 3 and Comparative Example 1.
Figure 4:
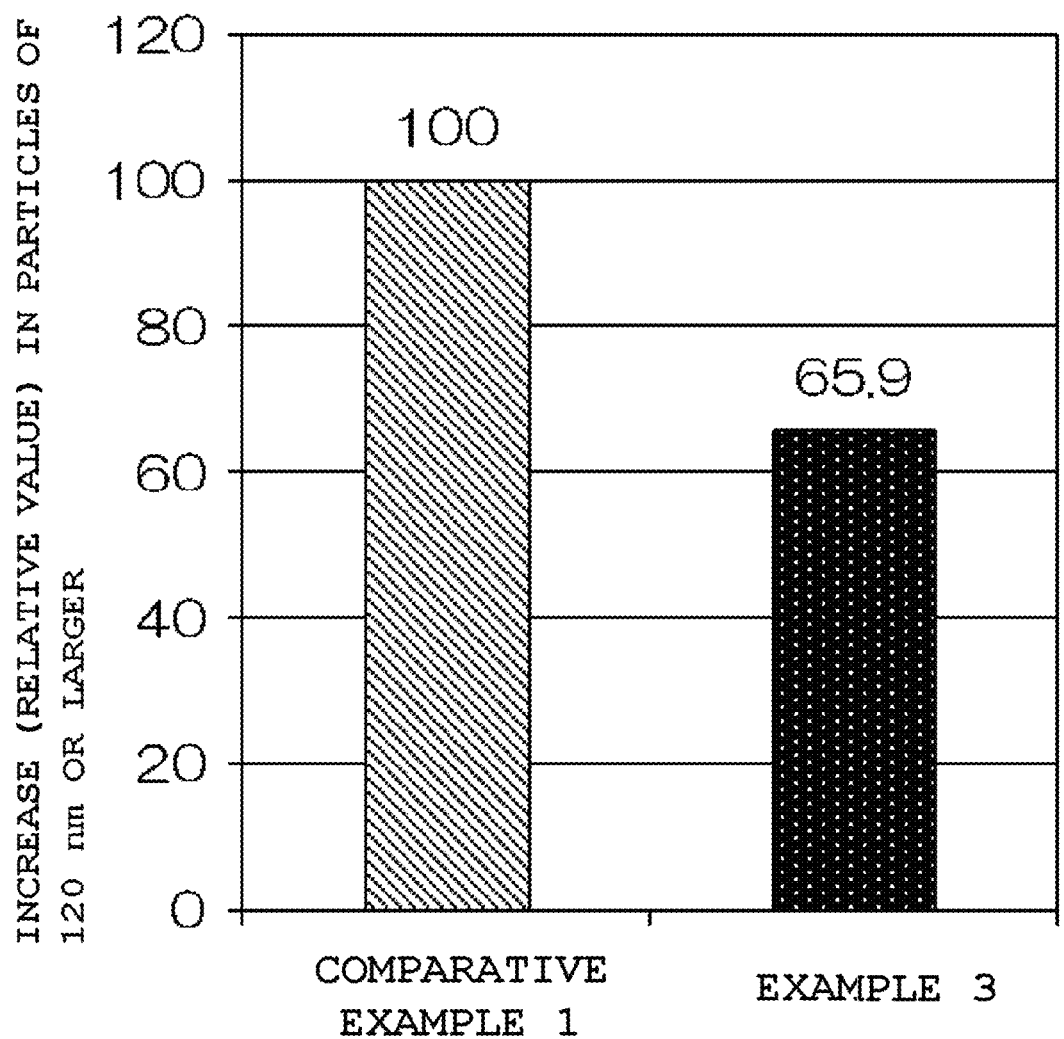
FIG. 4 is a graph for comparing the number of particles of 120 nm or larger per silicon wafer after the SC-2 cleaning by relative values between Example 3 and Comparative Example 1.
Figure 5:
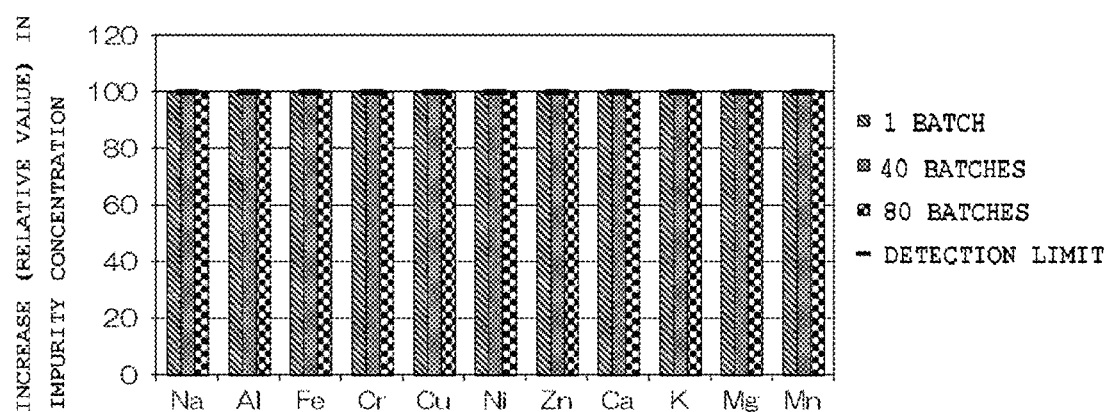
FIG. 5 is a graph showing relations between metal impurity concentrations on the silicon wafer surface after the SC-2 cleaning and the number of cleaning batches for SC-2 cleaning in Example 3.

Note that FIGS. 2 to 4 are graphs for comparing the number of particles per silicon wafer after the SC-2 cleaning by relative values between Example 3 and Comparative Example 1. FIGS. 2 to 4 show each average result of 25 silicon wafers cleaned in the 80th batch. FIG. 2 shows the number of particles of 26 nm or larger measured with SP3, FIG. 3 shows the number of particles of 45 nm or larger measured with SP2, and FIG. 4 shows the number of particles of 120 nm or larger measured with SP2. Moreover, FIG. 5 is a graph showing relations between metal impurity concentrations on the silicon wafer surface after the SC-2 cleaning and the number of cleaning batches for SC-2 cleaning in Example 3.

It should be noted that the present invention is not limited to the above embodiments. The embodiments are illustrative examples, and any example which has substantially the same configuration and exerts the same functions and effects as the technical concept described in claims of the present invention is included in the technical scope of the present invention.

TABLE 1

| | SC-2 | | | | Wafer quality after cleaning | | | | | | | |
| | First tank | | Second tank | | Particles Increased amount | Impurity concentration | | | | | | |
| | HCl (mass %) | $H_2O_2$ (mass %) | HCl (mass %) | $H_2O_2$ (mass %) | (relative value) | Al | Ca | Mg | Cu | Fe | Ni | Zn |
| Comparative Example 1 | 0.4 | 0.4 | 0.4 | 0.4 | 100.0 | N.D. | N.D. | N.D. | N.D. | N.D. | N.D. | N.D. |
| Comparative Example 2 | 0.4 | 0.4 | no second tank | | 17.8 | detected | N.D. | N.D. | N.D. | N.D. | N.D. | N.D. |
| Example 1 | 0.4 | 0.4 | 0.2 | 0.4 | 68.2 | N.D. | N.D. | N.D. | N.D. | N.D. | N.D. | N.D. |
| Example 2 | 0.4 | 0.4 | 0.04 | 0.4 | 7.8 | N.D. | N.D. | N.D. | N.D. | N.D. | N.D. | N.D. |
| Example 3 | 0.4 | 0.4 | 0.01 | 0.4 | 6.2 | N.D. | N.D. | N.D. | N.D. | N.D. | N.D. | N.D. |
| Example 4 | 0.4 | 0.4 | 0.01 | 0.1 | 19.4 | N.D. | N.D. | N.D. | N.D. | N.D. | N.D. | N.D. |

As shown in Table 1, Comparative Example 1 had two SC-2 tanks containing SC-2 solutions having sufficient chemical concentrations (the HCl concentrations in both the initially- and secondly-used tanks were 0.4 mass %). Consequently, the metal impurity levels were favorable, but the amount of particles increased was large. Since the number of tanks is reduced from two to one in Comparative Example 2, the amount of particles increased was small, but a large amount of Al was detected. This suggests that the metal removal ability was decreased. In contrast to these, in Examples 1 to 4, the HCl concentration in the secondly-used tank was set to be lower than that in the initially-used tank. Consequently, the amount of particles increased was small, and the amount of Al detected was also at the detection lower limit or smaller and favorable.

Moreover, as shown in FIGS. 2 to 4, in Example 3 where the SC-2 cleaning in the downstream tank was performed under the low concentration condition, the number of particle was reduced in all the types of particle diameters in comparison with Comparative Example 1 where the SC-2 cleaning in the upstream tank and the downstream tank was performed under the same concentration condition. Further, as shown in FIG. 5, under the conditions in Example 3, the metal impurity levels were not degraded even when the number of cleaning batches was increased.

The invention claimed is:

1. A method comprising:
   cleaning a semiconductor wafer with a plurality of chemical tanks, each chemical tank in the plurality of chemical tanks contains a Standard Cleaning 2 (SC-2) solution, wherein
      in an initially-used chemical tank of the plurality of chemical tanks used in the cleaning of the semiconductor wafer, an HCl concentration in the SC-2 solution contained in the initially-used chemical tank is in a range of from 0.3 to 2 mass %,
      in a final chemical tank of the plurality of chemical tanks used in the cleaning of the semiconductor wafer, an HCl concentration in the SC-2 solution contained in the final chemical tank is in a range of from 0.001 to 0.2 mass % and the final chemical tank has lowest HCl concentration in the SC-2 solution among each SC-2 solution contained in each of chemical tanks in the plurality of chemical tanks used to clean the semiconductor wafer, and
      the SC-2 solution in each of the chemical tanks in the plurality of chemical tanks comprises an aqueous solution of hydrochloric acid and hydrogen peroxide.
2. The method for cleaning a semiconductor wafer according to claim 1, wherein the semiconductor wafer is a silicon wafer.

3. A method comprising:

cleaning a semiconductor wafer with a plurality of chemical tanks, wherein the plurality of chemical tanks comprises at least two chemical tanks that each contains a Standard Cleaning 2 (SC-2) solution that comprises an aqueous solution of hydrochloric acid and hydrogen peroxide, in one of the at least two chemical tanks, an HCl concentration in the SC-2 solution is in a range of from 0.3 to 2 mass %, in an other one of the at least two chemical tanks, an HCl concentration in the SC-2 solution is in a range of from 0.001 to 0.2 mass %, and the semiconductor wafer is cleaned in the chemical tank in which the HCl concentration in the SC-2 solution is in the range of from 0.3 to 2 mass % before cleaning in the chemical tank in which the HCl concentration in the SC-2 solution is in the range of from 0.001 to 0.2 mass %.

4. The method for cleaning a semiconductor wafer according to claim 3, wherein the semiconductor wafer is a silicon wafer.

* * * * *